United States Patent [19]
Hartleroad et al.

[11] 3,912,153
[45] Oct. 14, 1975

[54] METHOD AND APPARATUS FOR BONDING SEMICONDUCTOR PILL-TYPE COMPONENTS TO A CIRCUIT BOARD

[75] Inventors: Ronald J. Hartleroad, Twelve Mile; James P. Grabowski, Carmel, both of Ind.

[73] Assignee: General Motors Corporation, Detroit, Mich.

[22] Filed: Nov. 18, 1974

[21] Appl. No.: 524,899

[52] U.S. Cl. .................... 228/254; 228/253; 228/56
[51] Int. Cl.$^2$ ...................... B23K 35/12; B23K 3/06
[58] Field of Search ............ 29/502; 228/51, 53, 56, 228/57

[56] References Cited

UNITED STATES PATENTS

| | | | |
|---|---|---|---|
| 3,396,894 | 8/1968 | Ellis | 228/56 |
| 3,765,590 | 10/1973 | Duffek | 29/502 X |

*Primary Examiner*—Al Lawrence Smith
*Assistant Examiner*—Margaret M. Joyce
*Attorney, Agent, or Firm*—Robert J. Wallace

[57] ABSTRACT

A method and apparatus for bonding miniature semiconductor pill-type components directly to a circuit board. Each pill-type component has a semiconductor device chip encapsulated in a plastic body and an array of leads radially extending from the body. The body is placed on a probe extending through an opening in a printed circuit board bonding site. A tubular soldering member is positioned over the component. A hot gas is blown through the soldering member and directed toward the bonding site to pre-melt solder on circuit board conductors corresponding to the component leads. The component leads and circuit board conductors are aligned while looking through the tubular soldering member. An end surface on the soldering member presses the component leads against their corresponding circuit board conductors. A holding tool inserted through the soldering member abuts the component body to hold the component in place when the soldering member is removed.

5 Claims, 9 Drawing Figures

METHOD AND APPARATUS FOR BONDING SEMICONDUCTOR PILL-TYPE COMPONENTS TO A CIRCUIT BOARD

BACKGROUND OF THE INVENTION

This invention relates to a method and apparatus for bonding semiconductor components. More particularly, it relates to a method and apparatus for bonding extremely small semiconductor pill-type components directly to a circuit board.

The semiconductor pill-type component is a plastic encapsulated semiconductor device package. In the package, a semiconductor device chip is encapsulated in a plastic body and an array of leads radially extend outwardly from the body. The semiconductor device chip may be a discrete transistor or diode, but generally would be an integrated circuit chip. Inner portions of the leads within the plastic body are connected to various contact areas on the chip. The portions of the leads outside the body provide means for electrical interconnection between the chip and external circuitry.

A principal advantage of the "pill" package design is that it is a low cost subassembly that can be readily tested before mounting in another product. Briefly, the pills are made by bonding semiconductor device chips to leads on a lead frame that serves as a temporary carrier. Each group of leads on the frame includes at least two pill holding tabs that are not electrically functional. The chips are each separately encapsulated with plastic to form a tablet-shaped body, a pill, with outer portions of the chip leads left exposed. All leads, except the supporting holding tabs, are severed from the lead frame. Each chip is then tested while it is still attached to the lead frame by the holding tabs. Those pills meeting acceptable standards are removed from the lead frame and subsequently mounted onto a larger lead structure for reencapsulation as a dual-in-line package (DIP). The miniature size and shape of the pill readily facilitates bonding it inside the DIP which in turn can be mounted onto a printed circuit board or the like by conventional techniques.

In our concurrently filed applications Ser. Nos. 525,022 and 524,974 both filed Nov. 18, 1974, entitled "Method and Apparatus for Bonding Miniature Semiconductor Pill-Type Components to a Circuit Board," which also have the same assignee as the present invention, it was recognized that it would be advantageous to bond the pill directly to the circuit board thereby eliminating the expense of the DIP. In those patent applications the pill was directly transferred from the lead frame and bonded to the circuit board. In the present patent application, however, the pill has already been removed from the lead frame. The pill may have been removed for a variety of reasons. For example, it may have been removed while preforming the leads into a special configuration. The special lead configuration may be designed to compensate for the different thermal expansion coefficients between the pill and the circuit board.

The present patent application also permits the manufacturer to solder the pill directly to the circuit board without requiring an intermediate lead structure such as the DIP. Furthermore, the apparatus of the present invention is designed to facilitate efficient production alignment of the miniature pill with the circuit board and promotes improved solder joints therebetween.

OBJECTS AND SUMMARY OF THE INVENTION

Therefore, it is an object of this invention to provide a method and apparatus for bonding semiconductor pill-type components directly to a printed circuit board which facilitates efficient production handling of the component and which provides excellent soldered connections between the component leads and their corresponding circuit board conductors.

It is a further object of this invention to provide an apparatus and method of using it, wherein the apparatus facilitates alignment of the component leads with their corresponding circuit board conductors, provides means by which a hot gas is directed toward the conductors to pre-melt solder on the conductors and which also serves as a device for soldering the component leads to the conductors.

Briefly, these objects are accomplished by inserting a probe through an opening in a printed circuit board. Solder-coated conductors on the circuit board converge on the opening and correspond to leads on the pill-type component. The pill-type component includes a plastic body encapsulating a semiconductor device and an array of leads radially extending from the body. The body of the pill-type component is placed on the probe. A tubular soldering member is positioned over the component. The soldering member includes a vertically extending bore with a diameter slightly larger than that of the component body. A hot gas is blown through the bore in the soldering member and directed toward the solder coated conductors. In such a manner, the solder on the conductors is melted and the soldering member is concurrently heated. The component leads and circuit board conductors are aligned while looking through the bore in the soldering member during the hot gas flow. The soldering member is then moved downwardly until its end surface presses the component leads against their corresponding circuit board conductors. A rod-like hold down tool is then inserted into the bore of the soldering member to abut the component body. The soldering member is then vertically lifted from the component leads while leaving the hold down tool abutting the component body to hold the component in place after removal of the heated soldering member. After the solder has solidified, the tool and the probe are withdrawn to leave the component permanently soldered to the circuit board.

DESCRIPTION OF THE PREFERRED EMBODIMENT

Figures 1, 2, 3:
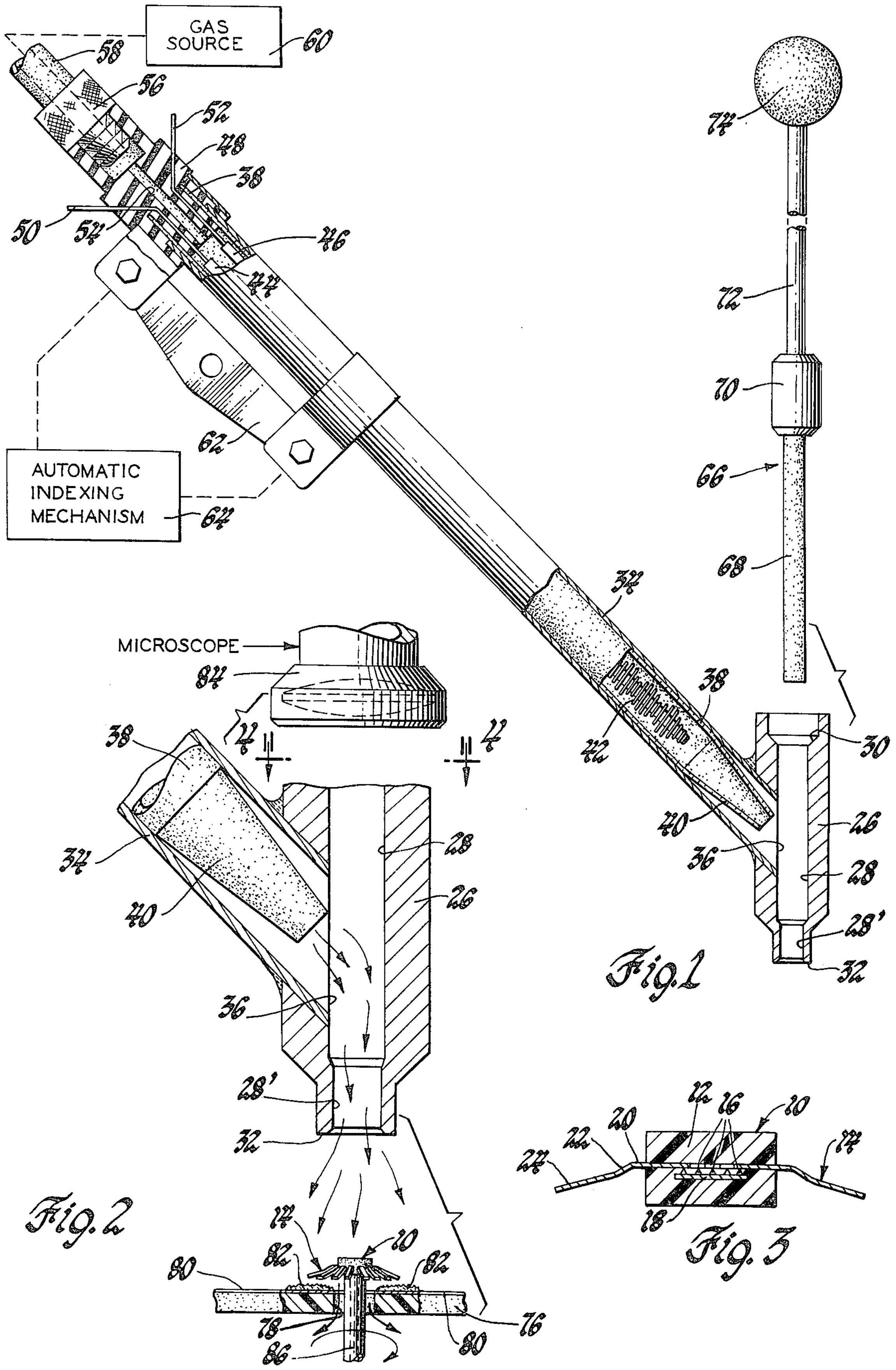
FIG. 1 shows an elevational view with parts broken away of one embodiment of the apparatus of this invention.
FIG. 2 shows an enlarged fragmentary sectional view with parts in elevation of the apparatus shown in FIG. 1 during one step of the method of this invention.
FIG. 3 shows an enlarged sectional view of a semiconductor pill-type component.

One embodiment of a semiconductor pill-type component, designated by the numeral 10, is shown most clearly in FIG. 3. A pill-type component or pill is a miniature semiconductor device subassembly package. The package includes a plastic body encapsulating a semiconductor device, generally an integrated circuit, and an array of leads radially extending from the body. In this embodiment, pill 10 has a circular right cylindrical or disc-shaped plastic body 12 and a plurality of leads 14 radially extending from body 12. Leads 14 are connected at their innermost free ends to contact bumps 16 on an integrally leaded semiconductor device, such as flip chip 18. Leads 14 provide electrical interconnection between chip 18 and external circuitry.

We have discovered that the "seagull" type lead configuration as shown in the drawings provides improved characteristics, both electrically and mechanically. Body 12 has a diameter of about 0.14 inch. The inner portions 20 of the leads 14 extend horizontally from body 12 and define a circular diameter of about 0.170 inch. The middle portions 22 of the leads 14 slop downwardly at an angle of about 30°. The outer periphery of the middle portions 22 of leads 14 define a circular diameter of about 0.180 inch. In contrast, the outer or foot portions 24 of leads 14 slop downwardly at an angle of only about 15° from the horizontal plane. The outer periphery of foot portions 24 define a circular outer diameter of about 0.260 inch. The downward sloping angle of the middle portions 22 of leads 14 provide stress relief between the pill and the circuit board on which it is to be mounted. This allows the pill to flex vertically in response to the different thermal coefficients of expansion between the pill 10 and the circuit board. The inner 20, middle 22, and foot 24 portions of leads 14 are formed in such manner that there are no sharp bends throughout the entirety of leads 14. Such a seagull type lead configuration minimizes any stress points in the leads which tend to occur if the leads are bent at acute angles. The slight downward angle on the foot portions 24 of the leads 14 ensures a good electrical and mechanical connection between the leads 14 and their corresponding circuit board conductors. Foot portions 24 provide a relatively large surface for soldering purposes and further compensate for possible nonplanarity of the leads 14 or the circuit board conductors which may deleteriously affect electrical connections between the pill and the circuit board. While this seagull type lead configuration is preferred because of the above advantages, the apparatus and method of this invention is applicable to other lead configurations as well, such as entirely horizontally extending leads.

Referring now to FIGS. 1 and 2, there is shown one embodiment of the apparatus of this invention. A tubular soldering member 26 is made of stainless steel. Soldering member 26 is tubular with a circular outside diameter at its upper portion of about 9/16 inch. The lower portion of soldering member 26 narrows down to a circular outside diameter of about 4/16 inch. There is a vertically extending bore 28 in soldering member 26. The bore is enlarged in the upper portion of soldering member 26 in a countersunk fashion to provide receiving shoulder 30. The lower end 28′ of bore 28 has a diameter of about 0.20 inch. It is chamfered at its lowermost end diverging to end surface 32 for soldering member 26. End surface 32 is flat and is adapted to engage all of pill leads 14 simultaneously.

Soldering member 26 has a hollow tubular stainless steel pipe 34 welded to its side. Pipe 34 communicates with a corresponding opening 36 in bore 28. Pipe 34 is attached to soldering member 26 at an angle of about 45° from the horizontal plane so that it is directed downwardly toward end surface 32. It should be noted that only the portions of the pipe 34 nearest soldering member 26 are necessarily bifurcately attached to soldering member 26. For purposes of this invention, by bifurcately attached we mean that the lower portions of pipe 34 and the upper portions of soldering member 26 define an acute angle therebetween so that pipe 34 is directed downwardly toward end surface 32. In this preferred embodiment, pipe 34 is a unitary hollow circular rod with an outer diameter of about 7/16 inch and a wall thickness of about 1/32 inch. In this example, pipe 34 extends approximately 8½ inches from soldering member 26.

A hollow quartz housing 38 is coaxially mounted within pipe 34. Housing 38 includes a nozzle 40 projecting toward opening 36 in soldering member 26. A heater coil 42 is coaxially mounted longitudinally in housing 38. Heater coil 42 includes a plurality of wire turns surrounding a ceramic insulative coaxially extending rod. Upper portions of heater coil 42 include crimped connectors 44 and 46. A rubber stopper 48 has annular indentations therein for receiving the upper ends of pipe 34 and housing 38. Extending through stopper 48 are two electrically conductive terminals 50 and 52. Terminals 50 and 52 are connected to connectors 44 and 46, respectively. Terminals 50 and 52 can be connected to a source (not shown) to provide current to heater coil 42. Stopper 48 has a passageway 54 therein. An inlet member 56 on the end of flexible hollow tubing 58 is coupled to the upper portions of stopper 48. Tubing 58 communicates with a gas source 60. Gas source 60 typically supplies a reducing gas such as a hydrogen and nitrogen gas mixture.

A clamp 62 is secured to the upper portion of pipe 34 as shown in FIG. 1. Clamp 62 in turn is connected to an automatic indexing mechanism 64 which provides an automatically controlled upward and downward movement. In such manner a corresponding upward and downward movement is applied to soldering member 26. If desired, automatic indexing mechanism 64 can also provide horizontal movement to swing soldering member 26 into position.

Hold down tool 66 is shown most clearly in FIG. 1. Hold down tool 66 includes an elongated rod 68 of a circular cross section with a diameter of about ⅛ inch. Rod 68 is made of a heat resistant material, such a Vespar (a high temperature plastic) or ceramic, which can withstand high temperatures and to which solder and solder flux will not readily adhere. Rod 68 is approximately 3 inches long. The uppermost part of rod 68 is connected to an enlarged stop member 70. The lower portions of stop member 70 seat on shoulder 30 in the top of soldering member 26. A shaft 72 is connected to the upper portion of stop member 70. A knob 74 on the top of shaft 72 facilitates handling of hold down tool 66. Hold down tool 66 weighs approximately 2 ounces.

Turning to FIG. 2, there is shown a printed circuit board 76. There is an opening 78 in circuit board 76 which is circular and has a diameter of about 0.180 inch. A plurality of printed conductors 80 converge to opening 78 in a pattern that corresponds to pill leads 14. A solder coating 82 on the innermost portions of conductors 80 is shown of exaggerated thickness. Solder coating 82 is also shown with exaggerated non-uniformity. This non-uniformity is inherently present after solidification of the solder subsequent to known coating processes such as wave soldering process techniques. As shown in FIG. 2, a microscope 84 or other visual enlargement means is positioned in coaxial mutual relationship with soldering member 26, pill 10 and opening 78 in circuit board 76. A hollow vacuum probe 86 is connected to a suitable vacuum source (not shown). Vacuum probe 86 is also connected to a suitable mechanism which provides rotational, vertical, and horizontal movement to vacuum probe 86. If desired, the circuit board can be similarly attached to mechanisms for moving it for purposes of alignment.

According to the method of our invention, vacuum probe 86 is inserted into circuit board opening 78. The pill body 12 is then placed on the end of vacuum probe 86 and is secured thereto by the vacuum. This can be done either manually or by automated machinery, such as a "pick and place" mechanism which is known in the art. It should also be noted that the pill leads 14 have already been formed into the seagull type configuration. Soldering member 26 is then positioned about 3 inches above the top of circuit board 76. Soldering member 26 is positioned so that bore 28 is coaxially aligned with pill body 12. Analogously, microscope 84 is positioned about 3 inches above the top of soldering member 26. Soldering member 26 and the microscope 84 can be moved into position by a variety of known techniques. For example, automatic indexing mechanism 64 can swing soldering member 26 into position. In the same manner microscope 84 can be supported so that it can be readily moved into position.

Gas source 60 is activated to force gas into the pipe 34 via passageway 54 in rubber stopper 48. Heater coil 42 is energized by passing current through the coils to provide a heat source for heating the gas to about 450°F. The heated gas is blown out of nozzle 40 as can be seen in FIG. 2. Since the gas enters soldering member 26 at an angle, the hot gas readily heats soldering member 26 to a temperature of about 410°F. As can be seen in this drawing, the gas is directed toward the pill 10 and solder-coated circuit board conductors 80.

Figure 4:
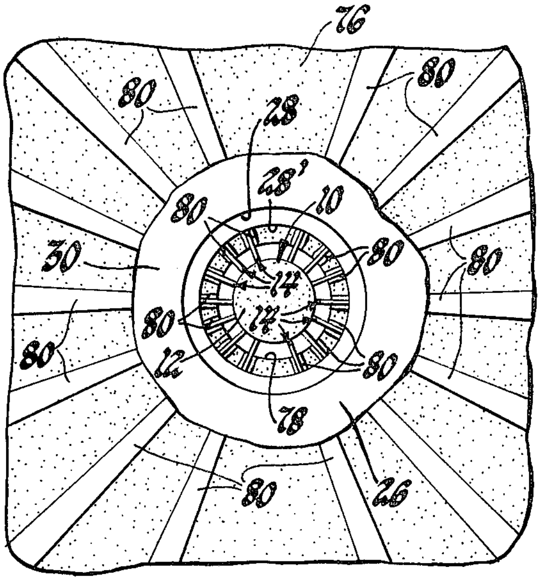
FIG. 4 shows a fragmentary plan view along the lines 4—4 of FIG. 2 in which portions of the apparatus of FIG. 1 is broken away.

Referring now especially to FIG. 4, the pill leads 14 are aligned with the innermost portion of their corresponding circuit board conductors 80. It is a feature of this invention that an operator can view this alignment by looking through bore 28 in the soldering member 26 via microscope 84. As can be seen in FIG. 4, the small inside diameter of the end 28' of bore 28 is chosen to be slightly larger than the diameter of the pill body 12, yet smaller than the outer diameter defined by the pill leads 14. In such manner, an operator can view the inner portions of the pill leads 14 and the innermost portions of the corresponding circuit board conductors 80. While looking through bore 28, the pill leads 14 are aligned with their corresponding circuit board conductors 80. This can be accomplished, for example, by rotating and/or horizontally moving vacuum probe 86 until the pill leads 14 and circuit board conductors 80 are aligned. If desired, the circuit board 76 can be analogously positioned until the pill leads 14 and circuit board conductors 80 are aligned. It should be noted that the particular construction of the apparatus of this invention permits the hot gas to remain blowing through bore 28. The hot gas is transparent and therefore will not deleteriously affect visual alignment. In such manner, soldering member 26 is continually heated by the hot gas.

Figure 5:
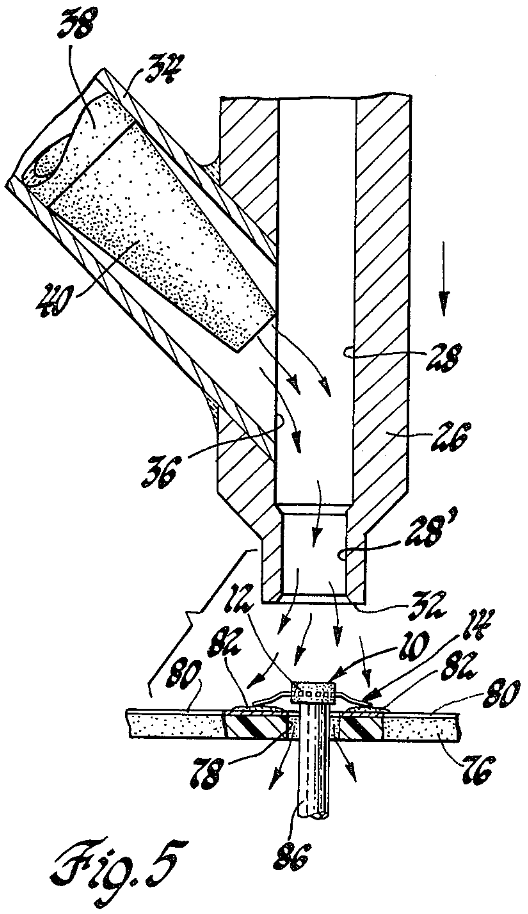
FIGS. 5-9 show views similar to FIG. 2 during successive steps in the method of this invention.

Referring now to FIG. 5, after alignment of the pill leads and circuit board conductors, the automatic indexing mechanism 64 is activated to begin downward movement of soldering member 26. It is a feature of this invention that the otherwise uneven or non-uniform soldering coating 82 is melted to a smooth molten state by the hot gas. It is melted into the smooth molten state when the end surface 32 of soldering member 26 moves within about ¼ inches of the conductors 80. At this point, the heat from the hot gas is high enough to melt the solder which, in this example, has a melting point of about 368°F. After solder coating 82 is melted, vacuum probe 86 is lowered so that pill leads 14 rest on the molten solder on their corresponding circuit board conductors 80. In such manner, none of the pill leads are unduly stressed by an uneven height of the solder coating 82. Furthermore, we have discovered that premelting solder coating 82 facilitates an improved solder joint between the pill leads 14 and circuit board conductors 80. We should like to emphasize that the opening 78 in circuit board 76 is essential for optimum results. As designated by the arrows in the drawings, the hot gas can flow through the opening 78. If it were not for opening 78, a pressure dome effect occurs in which the hot gas will not uniformly melt solder coating 82. It should also be noted that another incidental benefit of the hot gas is that it tends to force any excess solder on the circuit board between the conductors back onto the conductors thereby protecting against possible shorts.

Figure 6:
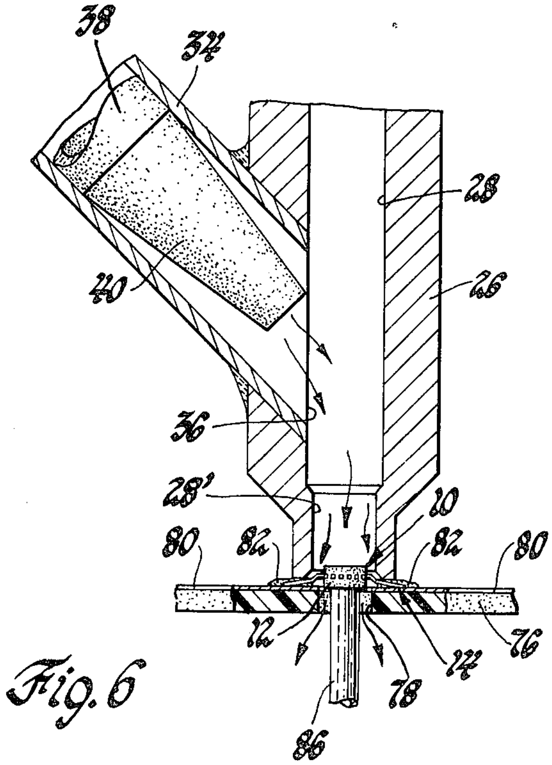
Figures 7, 8, 9:
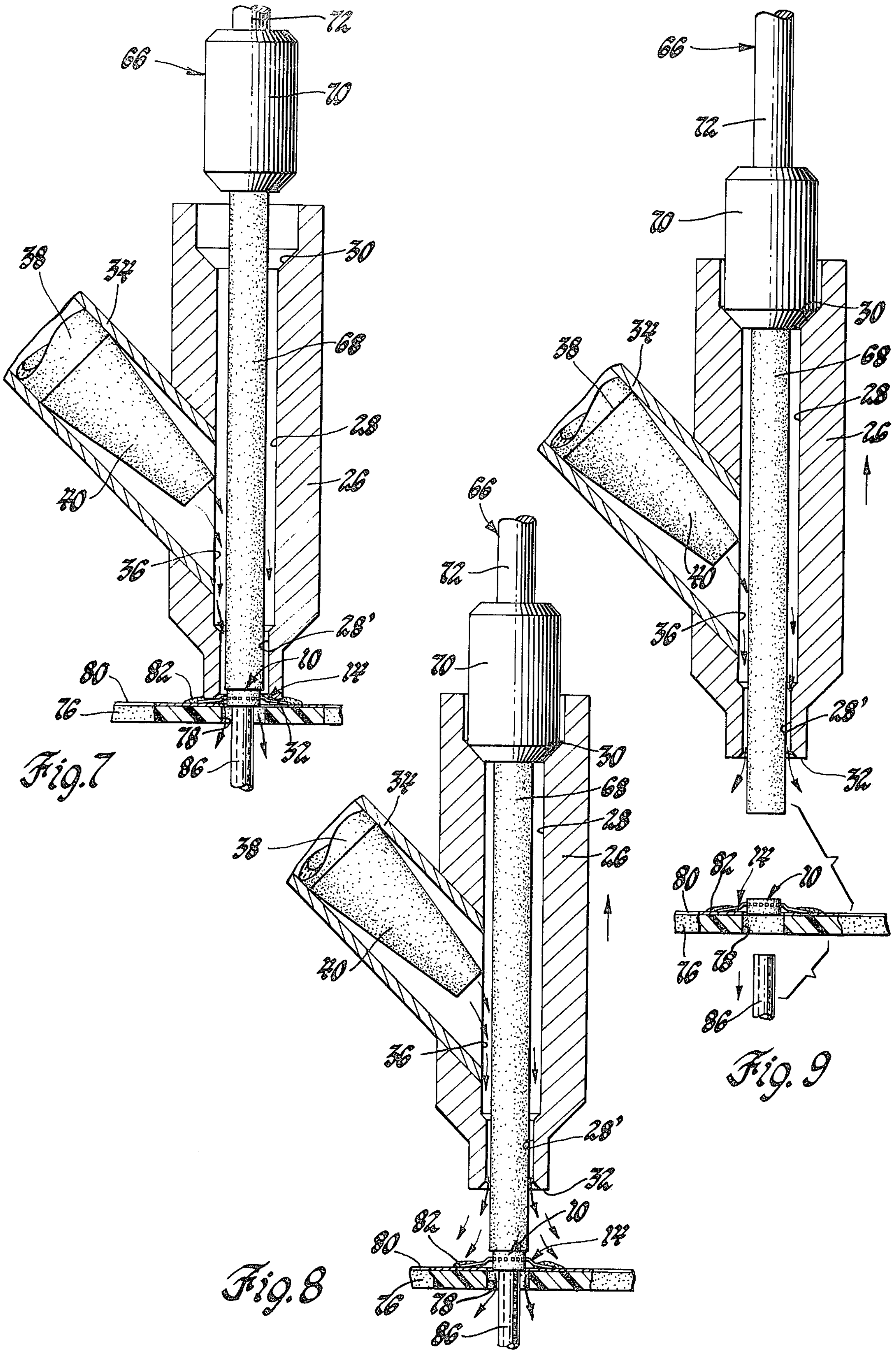

Referring now to FIG. 6, further downward movement of soldering member 26 causes the end surface 32 to press all of the pill leads 14 simultaneously against their corresponding circuit board conductors 80. Since the soldering member 26 is heated to a temperature of about 410°F., the molten solder wets the end surface of soldering member 26 and consequently is drawn up over the top of the pill leads 14 to provide an improved solder joint in which solder completely covers each of the pill leads 14. It is another feature of this invention that the operator looking through microscope 84 can observe the solder operation to insure that good electrical connection is made between all of the leads. We have discovered that solder flow on the inner portions of the pill leads 14 is indicia of a good solder joint. Hence, soldering member 26 does not have to be removed before inspection can take place. With the seagull type lead configuration, end surface 32 need not abut the entirety of lead foot portions 24. Since foot portions 24 are sloping downward slightly, end surface 32 abuts only the top part of each foot portion 24 as can be seen in FIGS. 6 and 7. Therefore, there is more room for the solder to cover the leads.

Turning now to FIG. 7, hold down tool 66 is then inserted into the bore 28 of soldering member 26. The end of rod 68 abuts the pill body 12 to provide a downward force on the pill leads 14. The operator can insert hold down tool 66 manually. If desired, hold down tool 66 can be inserted automatically by connection to a suitable mechanism cooperating with the automatic indexing mechanism 64.

Referring now to FIG. 8, soldering member 26 is vertically raised from the pill leads by the automatic indexing mechanism 64. It is an important feature of this invention that the rod 68 of hold down tool 66 remains abutted against pill body 12 until the solder solidifies. This counteracts the tendency of pill leads 14 to adhere to the heated soldering member 26. Rod 68 also restricts but does not close the passageway for the gas to flow out of the bottom of bore 28. It is believed that this increases the velocity of the gas emerging out of bore 28 as depicted by the increased number of arrows in FIG. 8. This tends to give a cooling effect on the previously melted solder. In such manner the solder is quickly solidified without the need of an additional cooling media, such as a cool gas.

The operation is completed upon further vertical lifting of soldering member 26 and the removal of vacuum probe 86 as can be seen in FIG. 8. Stop member 70 seats in shoulder 30 to automaticallly remove hold down tool 66 from pill 10 after the solder solidifies. The entire operation as just described can be completed in about 3 seconds. The finished product is shown in FIG. 9. The middle portions 22 of leads 14 are now at an angle of about 45°, with respect to the circuit board. We have discovered that this angle provides excellent stress relief over a wide range of operating temperatures, for example, those encountered in automotive radio applications. As a result of the method just described, foot portions 24 have been flattened somewhat to an angle of about 10° with respect to the circuit board.

It is an important aspect of this invention that another pill can be similarly bonded to another circuit board promptly without having to wait for soldering member 26 to become heated above the melting point of the solder. This is because the hot gas is continually heating soldering member 26. Although some of the heat will be dissipated during the soldering operation, the temperature of soldering member 26 will be restored to the needed temperature within about 2 seconds. Therefore, a new pill can be bonded very quickly using the same soldering apparatus.

Through the use of the method and apparatus embodied in this invention, a miniature semiconductor pill-type component can be bonded directly to a circuit board without necessitating packaging the pill in a larger housing, such as the DIP package. The apparatus and method is readily adaptable to well known production techniques. This invention further provides excellent solder joints with a minimum of time and effort. The soldering member not only serves as a type of soldering iron, but is also serves as a hot gas bonding torch which pre-melts the solder on the circuit board conductors. Furthermore, it is adapted to facilitate alignment of the pill leads and circuit board conductors. Moreover, the apparatus includes means by which such alignment is maintained during the soldering operation.

We claim:

1. A method of bonding miniature semiconductor pill-type components directly to a printed circuit board, said method comprising:

inserting a probe through an opening in a printed circuit board having a plurality of solder-coated conductors converging on said opening;

placing a body of a semiconductor pill-type component on said probe, said pill-type component including said body which encapsulates a semiconductor device chip and a plurality of discrete leads for said chip radially extending from said body and corresponding to said conductors on the circuit board;

positioning a tubular soldering member over said component and its corresponding circuit board conductors, said soldering member having a vertical bore extending therethrough and an end surface adapted for engaging said component leads;

blowing a hot gas through said bore in said soldering member to direct the flow of said gas toward said circuit board conductors thereby heating said soldering member and concurrently melting the solder on said circuit board conductors to a smooth, molten state; aligning said component leads with their corresponding circuit board conductors while viewing said leads and conductors by looking through said bore in the soldering member;

lowering said soldering member to engage the end surface thereof with said component leads to press them against their corresponding circuit board conductors;

inserting a rod-like component holding tool into the bore of said soldering member until an end of said tool abuts said component body thereby providing a downward force to the component;

sliding said soldering member upwardly along the length of said component holding tool to remove said end surface from said component leads, while leaving said holding tool within said bore and abutting said component body until said solder solidifies, thereby retaining component lead-conductor alignment during removal of said soldering member; and lifting said component holding tool and withdrawing said probe from said component body after solidification of said solder to leave said component permanently soldered to said circuit board.

2. A method of bonding miniature semiconductor pill-type components directly to a printed circuit board, said method comprising:

inserting a vacuum probe through an opening in a printed circuit board having a plurality of solder-coated conductors converging on said opening;

placing a body of a semiconductor pill-type component on said probe thereby temporarily securing said component to said probe, said component having a disc-shaped plastic body encapsulating a semiconductor device chip and a plurality of leads for said chip radially extending from said body, said component leads corresponding to said conductors on the circuit board;

positioning a tubular soldering member over said component and its corresponding circuit board conductors, said soldering member having a circular vertical bore extending therethrough and a flat end surface adapted for engaging said component leads, said bore having a diameter larger than the diameter of said component body yet smaller than the diameter defined by the outer periphery of said component leads;

blowing a hot gas through said bore in said soldering member to direct the flow of said gas toward said circuit board conductors thereby heating said soldering member and concurrently melting the solder on said circuit board conductors to a smooth, molten state;

rotating said probe to align the component leads with their corresponding circuit board conductors while viewing said leads and conductors by looking through said bore in the soldering member;

lowering said probe so that said component leads rest on the molten solder on their corresponding circuit board conductors;

lowering said soldering member to engage the end surface thereof with said component leads to press them against their corresponding circuit board conductors;

inserting a rod-like component holding tool into the bore of said soldering member until an end of said holding tool abuts said component body thereby providing a downward force to the component;

sliding said soldering member upwardly along the length of said component holding tool to remove said end surface from said component leads while leaving said holding tool within said bore and abutting said component body until said solder solidifies thereby retaining component lead-conductor alignment during removal of said soldering member; and lifting said component holding tool and withdrawing said vacuum probe from said component body after solidification of said solder to leave said component permanently soldered to said circuit board.

3. Apparatus for bonding a semiconductor pill-type component directly to a printed circuit board, said component having a plastic body encapsulating a semiconductor device chip and having an array of discrete leads for said chip radially extending from the body, said apparatus comprising:

an open ended, metallic tubular soldering member, said soldering member having two end surfaces, one of said surfaces being adapted to engage all of said component leads simultaneously, said soldering member having a longitudinal bore extending throughout its entire length between said end surfaces, said bore defining an opening in said one end surface which is larger than said component body yet smaller than the periphery defined by the outer portions of said component leads wherein alignment between said component leads and corresponding solder-coated circuit board conductors can be observed by looking through said bore from the other of said soldering member end surfaces, a hollow pipe attached to said soldering member at an acute angle with respect to the longitudinal axis of said bore and projecting away from said one end surface, said soldering member having an aperture in a side portion thereof providing an inlet to said bore, said pipe communicating with said aperture and a source of hot gas wherein hot gas can be blown through said bore and out of said opening in said soldering member one end surface, whereby solder on circuit board conductors can be premelted and said soldering member can be concurrently heated, said pipe providing a rigid protuberance which may be connected to a means for lowering said heated soldering member so that said one end surface can engage and press all of said component leads against their corresponding circuit board conductors thereby providing an excellent soldered connection between said component leads and their corresponding circuit board conductors, a component holding tool having a rod which is longer than said bore and smaller in transverse cross section than said bore, said rod being freely slidably insertable in the bore of said soldering member to abut said component body and provide a downward force on said component, wherein upon removal of said soldering member said component holding tool rod remains abutting against said component body until said solder solidifies thereby retaining said component lead-conductor alignment.

4. The apparatus of claim 3 in which said holding tool includes means for engaging said other end surface of said soldering member during removal to automatically lift said rod from the component body after solidification of the solder.

5. Apparatus for bonding a miniature semiconductor pill-type component directly to a printed circuit board, said semiconductor pill-type component having a disc-shaped plastic body encapsulating a semiconductor device chip and a plurality of discrete leads for said chip radially extending therefrom, said body having a diameter of $D_b$ inches, outer ends of said leads defining a circle with a diameter of $D_1$ inches, wherein said apparatus comprises:

an open ended, tubular metallic soldering member, said soldering member having a circular, longitudinal bore extending throughout its entire length, said bore having a diameter greater than $D_b$ yet smaller than $D_1$, one end of said soldering member having a surface adapted to engage all of said component leads simultaneously, an aperture in said soldering member above said end surface providing an inlet to said bore, a rigid tubular pipe communicating with said aperture, said pipe extending at an angle of about 45° from said bore and directed downwardly toward said end surface, a gas source communicating with said pipe for forcing gas therethrough in the direction of said soldering member, a heater coil in said pipe for heating said gas whereby said gas heats said soldering member and flows out of said bore in said end surface of the soldering member;

a printed circuit board having a circular opening therein with a diameter greater than $D_b$ yet less than the diameter of said bore, a plurality of solder-coated conductors on said circuit board, said conductors converging on said opening and corresponding to said component leads;

a vacuum probe extending through said opening in said circuit board for holding said component body and to facilitate alignment of said component leads with their corresponding circuit board conductor;

visual enlargement means located above said soldering member coaxially registered with said bore wherein component lead-circuit board conductor alignment can be observed by looking through the bore in said soldering member;

means attached to said pipe for lowering said soldering member wherein said hot gas pre-melts the solder on said circuit board conductors and then said end surface of said soldering member engages said component leads to press them against their corresponding circuit board conductors to promote an excellent soldered connection therebetween;

a holding tool for insertion in said bore of said soldering member, said holding tool having a rod which is longer than said bore and which is freely slidable therein, said rod for abutting said component body and providing a downward force to said component to hold the component in place after said heated soldering member is removed;

means attached to said pipe for sliding said soldering member upwardly along the length of said rod to remove said end surface from said component leads while leaving said rod abutting said component body to retain component lead-conductor alignment; and means on said holding tool for engaging upper portions of said soldering member during removal of said soldering member to automatically lift said rod from said component body after solidification of the solder.

* * * * *